(12) United States Patent
Ecker et al.

(10) Patent No.: US 7,714,670 B1
(45) Date of Patent: *May 11, 2010

(54) MONITORING AND COMPENSATING FOR REAL TIME LOCAL CIRCUIT SPEED IN AN INTEGRATED CIRCUIT

(75) Inventors: Reuven Ecker, Haifa (IL); David Moshe, Gilboa (IL)

(73) Assignee: Marvell Israel (M.I.S.L.) Ltd., Yokneam (IL)

( * ) Notice: Subject to any disclaimer, the term of this patent is extended or adjusted under 35 U.S.C. 154(b) by 89 days.

This patent is subject to a terminal disclaimer.

(21) Appl. No.: 12/079,079

(22) Filed: Mar. 24, 2008

Related U.S. Application Data

(63) Continuation of application No. 11/252,463, filed on Oct. 17, 2005, now Pat. No. 7,348,857.

(60) Provisional application No. 60/656,964, filed on Feb. 28, 2005.

(51) Int. Cl.
    G01R 23/00 (2006.01)
(52) U.S. Cl. ............................ 331/44; 331/65; 331/66
(58) Field of Classification Search .................. 331/44, 331/46, 55, 57, 65, 66
    See application file for complete search history.

(56) References Cited

U.S. PATENT DOCUMENTS

| | | | |
|---|---|---|---|
| 5,337,254 A * | 8/1994 | Knee et al. ................ 716/1 |
| 5,818,250 A | 10/1998 | Yeung et al. | |
| 6,657,504 B1 | 12/2003 | Deal et al. | |
| 6,668,346 B1 | 12/2003 | Schulz et al. | |
| 6,853,177 B2 | 2/2005 | Shibayama et al. | |
| 2004/0108866 A1 | 6/2004 | Burns et al. | |

OTHER PUBLICATIONS

"Extended Temperature Support for Cyclone Devices"; Altera White Paper; Altera Corporation, San Jose, CA; Jul. 2004, Ver. 1.1; 2 pages.
"How Do Dallas Semiconductor Delay Lines Work?"; Maxim Integrated Products; Dallas Semiconductor Maxim App Note 209; www.maxim-ic.com; Aug. 12, 2002; 4 pages.
"Tower Semiconductor adopts Legend's CharFlo-Memory!™ for quality assurance of commercially available memory compilers"; Internet Business Systems, Inc., Campbell, CA; www.legenddesign.com/DACafe/tower121503.shtml; Dec. 15, 2003; 2 pages.
Gill, Balkaran et al; "An Efficient BICS Design for SEUs Detection and Correction in Semiconductor Memories"; 2005 Design, Automation and Test in Europe (DATE 05) in Munich, Germany; Mar. 7-11, 2005; IEEE Computer Society; 6 pages.
Hamavand, Z.; "Temperature Sensor Solutions for Low-Voltage Systems"; National Semiconductor Corporation, Santa Clara, CA; www.national.com/nationaledge/jun05/article.html; Jun. 2005; 3 pages.

* cited by examiner

Primary Examiner—David Mis

(57) ABSTRACT

An integrated circuit comprises an oscillator that generates an oscillator signal. A first counter generates a first count based on transitions of the oscillator signal. A first circuit generates a match signal based on the first count and a reference count. A second counter generates a second count that is initialized at a starting count and adjusts the second count based on transitions of a reference clock signal. An output circuit outputs an oscillator speed based on the second count and the match signal. The oscillator speed is defined by a range that is independent of a frequency of the reference clock signal.

32 Claims, 11 Drawing Sheets

MONITORING AND COMPENSATING FOR REAL TIME LOCAL CIRCUIT SPEED IN AN INTEGRATED CIRCUIT

CROSS REFERENCE TO RELATED APPLICATION

This application is a continuation of U.S. Ser. No. 11/252,463, filed Oct. 17, 2005 (now U.S. Pat. No. 7,348,857, issued Mar. 25, 2008), which application claims benefit of earlier filed provisional patent application, U.S. Application No. 60/656,964, filed on Feb. 28, 2005, all of which are hereby incorporated by reference in their entirety.

BACKGROUND OF THE INVENTION

1. Field of the Invention

The present invention relates generally to integrated circuits, and more particularly, to monitoring circuit performance variations that may arise from variations in any one or more of manufacturing process, temperature or voltage.

2. Description of the Related Art

Variations in process, temperature and voltage (PVT) can influence the performance of an integrated circuit. For example, fluctuations in semiconductor manufacturing processes can result in variations in gate oxide thickness and doping concentrations, which can change transistor threshold voltage. Moreover, the mobility of charge carriers and the threshold voltage may vary with temperature. Thus, there has been a need to monitor and compensate for PVT induced variations in integrated circuit performance.

There are many prior approaches to monitoring and compensating for PVT variations. For instance, ring oscillators have been used to measure the number of ring oscillator cycles during a number of reference clock cycles. A ring oscillator may serve as a useful reference circuit since PVT variations ordinarily will influence its oscillation frequency. PVT induced changes in the ring oscillator frequency typically are indicative of PVT induced changes in the performance of other circuit components located on the same semiconductor chip. Also, some other prior approaches to PVT monitoring involved analogue measurement techniques.

While these past techniques for monitoring and compensating for PVT related variations in circuit performance generally have been acceptable, there has been a need for improvement. For example, there has been a need for a compact monitoring circuit that can provide an improved indication of the impact of PVT variations upon circuit performance over a wide range of reference frequencies, on an measurement scale that is independent of reference frequency. The present invention meets this need.

SUMMARY OF THE INVENTION

One aspect of the invention includes an integrated circuit that includes a first counter, a second counter and a variable oscillator. The variable oscillator has an oscillation time period that varies within an expected range with variations in one or more of process, voltage or temperature. In one embodiment, the variable oscillator is provides a signal that causes a count of the first counter to change at rate proportional to an oscillation frequency of the variable oscillator. The second counter receives a prescribed clock signal that has a prescribed oscillation time period that substantially does not vary with variations in one or more of process, time or voltage. The prescribed clock signal causes a count of the second counter to change at a rate proportional to the prescribed oscillation frequency. The second counter is operable to start a count from a start value and to count during a time interval during which the first counter counts a reference count interval. The start count value and the reference count interval are selected such that the second counter produces a count value indicative of variable oscillator speed at or about the moment when the count of the first counter finishes counting the reference count interval.

In another aspect of the invention, a method of monitoring performance of an integrated circuit includes the step of, setting a second counter to a start count value. A variable oscillator that has an oscillation time period that varies within an expected range with variations in one or more of process, voltage or temperature is used to provide a signal that causes a count of a first counter to change at rate proportional to an oscillation frequency of the variable oscillator. A reference clock source that has a frequency that substantially does not vary with variations in one or more of process, time or voltage is used to cause a count of a second counter to change, starting at the start value, at rate proportional to an oscillation frequency of the reference clock source. A determination is made as to when the first counter has counted a reference count interval. The start count value and the reference count interval are selected such that the second counter produces a count value indicative of variable oscillator speed at or about the moment when the count of the first counter finishes counting the reference count interval.

One embodiment of the invention includes first and second counters that serve as first and second means for counting. A ring oscillator serves as reference means for producing a reference oscillation signal that has a reference oscillation time period that varies within an expected range with variations in one or more of process, voltage or temperature. The ring oscillator causes the first counter to count in response to the reference oscillation signal. A clock terminal serves as a clock signal receiving means for receiving a clock signal that has an oscillation time period that substantially does not vary with variations in one or more of process, voltage or temperature. The clock terminal causes the second counter to count, starting from a start count value, in response to the clock signal. Control circuitry serves as control means for setting the start count value of the second means for counting, and also for causing the second counter to start to count at or about the moment when the first counter starts to count the reference count interval. In addition, the control circuitry in conjunction with a comparator circuit causes the second counter to stop counting at or about the moment when the comparator circuit determines that the first counter has counted a reference count interval.

In one embodiment, a start value is selected that is indicative of a product of variable oscillator time period at or about one end of the variable oscillator time period range, a scaling factor and a reciprocal of a variable oscillator oscillation time period range. The reference count interval is selected to have a value that is indicative of a product of clock period of the received clock signal, the scaling factor and the reciprocal of a variable oscillator oscillation time period range.

Thus, a monitor circuit and an associated method in accordance with an embodiment of the invention provide a measure of local circuit speed on a substantially fixed scale relative to frequency range of a variable oscillator regardless of a frequency of a reference signal. These and other features and advantages will become apparent from the following detailed description in conjunction with the appended drawings.

DETAILED DESCRIPTION OF THE PREFERRED EMBODIMENTS

The following description is presented to enable any person skilled in the art to make and use a novel local circuit speed monitor for use in an integrated circuit device and related methods accordance with the an embodiment of the invention, and is provided in the context of particular applications and their requirements. Various modifications to the preferred embodiments will be readily apparent to those skilled in the art, and the generic principles defined herein may be applied to other embodiments and applications without departing from the spirit and scope of the invention. Moreover, in the following description, numerous details are set forth for the purpose of explanation. However, one of ordinary skill in the art will realize that the invention might be practiced without the use of these specific details. In other instances, well-known structures and devices are shown in block diagram form in order not to obscure the description of the invention with unnecessary detail. Thus, the present invention is not intended to be limited to the embodiments shown, but is to be accorded the widest scope consistent with the principles and features disclosed herein.

Figure 1:
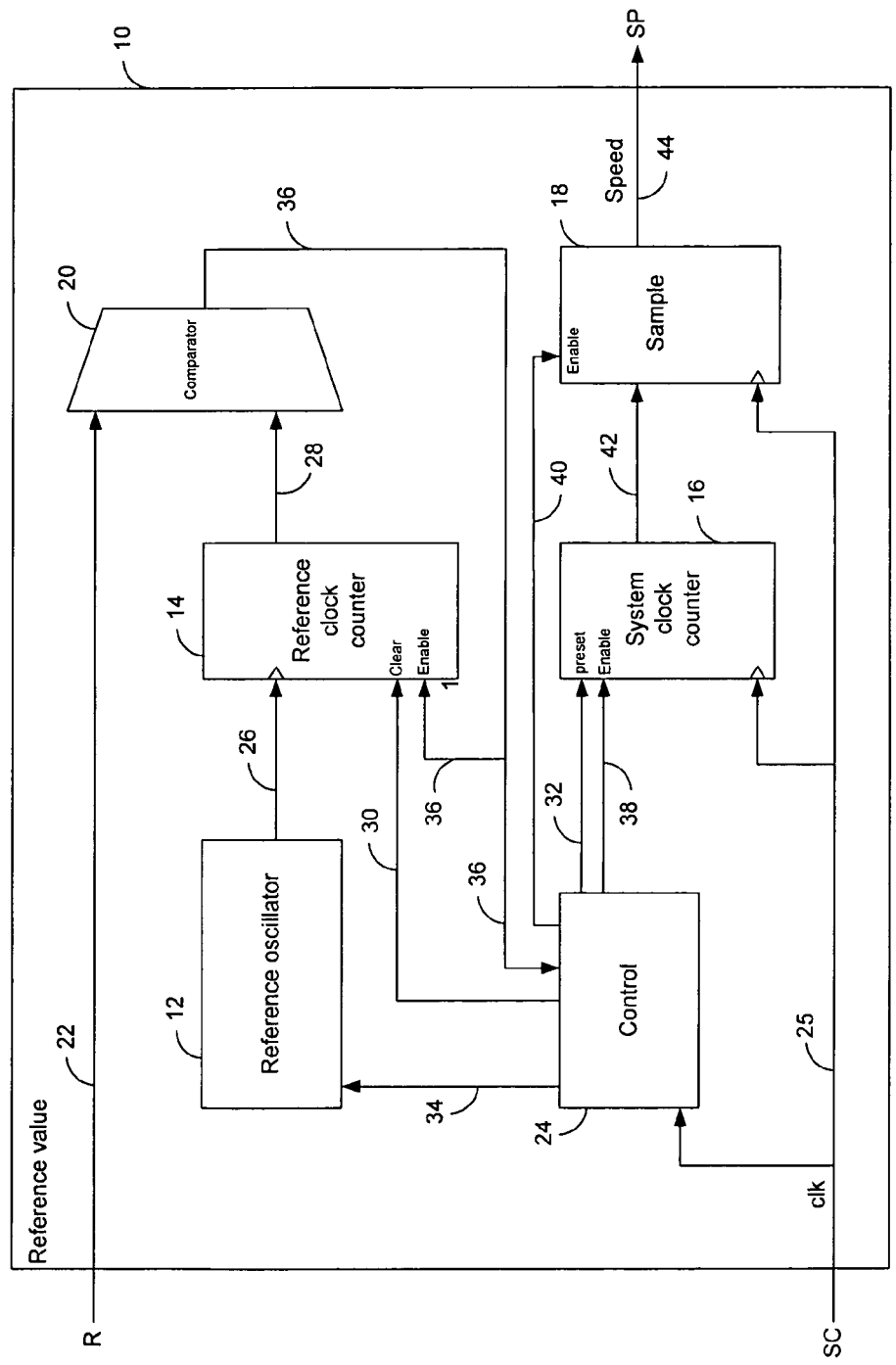
FIG. 1 is an illustrative block diagram of local circuit speed monitor circuitry in accordance with an embodiment of the invention.

FIG. 1 is an illustrative block diagram of local circuit speed monitor circuitry 10 in accordance with an embodiment of the invention. A variable oscillator 12 provides an output signal to a variable oscillator clock counter circuit 14. A system clock counter circuit 16 provides a system clock count signal to output circuit 18. In one embodiment, the system clock serves as a reference clock. A comparator circuit 20 is compares a count signal provided by the variable oscillator clock counter circuit 14 with a signal representing reference count value, R, on line 22. A control circuit 24 is controls the operation of the variable oscillator 12, reference clock counter 14, system clock counter 16 and output circuit 18. A system clock signal, SC, is provided via clock terminal 25 to each of the control circuit 24, system clock counter circuit 16 and output circuit 18.

In one embodiment, the variable oscillator 12 comprises a ring oscillator. A ring oscillator in its simplest form consists of an odd number of inverters connected in a circular chain. The circuit oscillates since it has no stable operation point. Ring oscillator frequency is determined by propagation delay through its chain of inverters.

The variable oscillator 12 is operable to provide a reference count changing signal via line 26 to the variable oscillator clock counter circuit 14. Since the variable oscillator 12 in a present embodiment comprises a ring oscillator, an output of the last inverter in the ring oscillator chain (not shown) provides via line 26 to an input of the variable oscillator clock counter circuit 14. Each time a signal completes its propagation through the entire chain of inverters in the ring oscillator, the output of the last inverter in the chain changes state of the count changing signal on line 26, and this state transition causes the counter circuit 14 to increment (or decrement depending upon the implementation) its count. The reference counter circuit 14 provides on line 28 count signal that is indicative of the number of oscillations of the variable oscillator 12, which is a ring oscillator in one embodiment counted by the counter circuit 14 during a prescribed reference interval.

Performance of the variable oscillator 12, as measured in terms of its operating frequency, depends upon factors such as one or more of, variations in temperature of the semiconductor chip in which the oscillator is disposed, deviations in voltage levels and fluctuations in semiconductor manufacturing processes used to produce the oscillator. Monitoring the oscillation frequency of the variable oscillator 12, therefore, serves as a mechanism to monitor the effects of PVT variations upon its performance. Since other circuit elements in the vicinity of the variable oscillator 12 are likely to experience the same PVT variations as the variable oscillator 12, the performance of the variable oscillator is indicative of the performance of other circuit elements nearby the variable oscillator 12.

Variations in process, voltage or temperature may be local in nature. For instance, circuitry in one region of an integrated circuit (IC) may be heated to a different temperature level than circuitry in a different region of the same IC. Alternatively, for example, due to fluctuations in manufacturing processes, oxide thicknesses and doping concentrations of transistors in one part of an IC may be different from oxide thicknesses and doping concentrations of transistors on another part of the same IC, even though the transistors on the different parts of the same circuit were designed to be identical. Thus, changes in the performance of the variable oscillator 12 due to PVT variations generally are indicative of changes in the performance of other circuit elements disposed nearby, in the same region of the IC as the variable oscillator 12.

In one embodiment, actual variable oscillator performance under actual PVT conditions, is determined by comparing variable oscillator frequency under such conditions with a known reference signal frequency so as to produce a comparison result that represents actual variable oscillator performance relative to expected variable oscillator performance over a range of PVT conditions. The comparison result is indicative of local circuit speed. Thus, the comparison result can be used as a basis for producing a signal causing nearby local circuit elements to compensate for variations in circuit speed. The manner of determining the expected oscillator performance over a range of PVT conditions is not a part of the invention and will be readily understood by persons of ordinary skill in the art. For instance, one approach to determining the expected variable oscillator performance over a range of conditions is to simulate the oscillator in both ends of extreme conditions using an appropriate circuit simulator such as SPICE. Alternatively, for example, another approach to determining the expected variable oscillator performance is to measure oscillator performance on actual silicon chips pushed to extreme conditions.

More specifically, in one embodiment a range of expected variable oscillator performance is specified in terms of worst corner PVT conditions, (i.e. slow process, low voltage, high temperature) and best corner PVT conditions (i.e., fast process, high voltage, low temperature). In one embodiment, a slowest (i.e. longest) expected oscillation time period, $T_S$, is defined for the worst corner, and a fastest (i.e. shortest) expected oscillation time period, $T_F$, is defined for the best corner. Thus, under the worst case (i.e., slowest) PVT conditions, it is expected that the variable oscillator 12 will have an oscillation period of $T_S$, and under the best case (i.e., fastest) PVT conditions, it is expected that the variable oscillator will have an oscillation period of $T_F$. Thus, the worst case and best case oscillation time periods $T_S$ and $T_F$ define a range of variable oscillator performance across a range of PVT conditions. Of course, conversely, the longest expected oscillation time period, $T_S$, corresponds to the lowest oscillation frequency, $1/T_S$, and the shortest expected oscillation time period, $T_F$, corresponds to the lowest oscillation frequency, $1/T_F$.

In one embodiment, the comparator 20 is used to compare a variable oscillator frequency with a known reference frequency by comparing a reference count value indicative of a known frequency with a variable oscillator count value. The system clock counter 16 keeps track of the number of system clock, SC, counts elapsed at the moment a value output by the reference clock counter 14 matches a count produced by the reference clock counter 14. The number of elapsed system clock counts is indicative of the performance (i.e. actual oscillation frequency) of the variable oscillator 12. Moreover, the system clock counter 16 starts its count at a value selected such that, at the variable oscillator count value at which the ring clock counter count matches the reference value, R, on line 22, the count value provided by the system clock counter 16 represents a scalar value that is indicative of the speed of operation of the variable oscillator 12 relative to the variable oscillator frequency range between worst case and best case corners.

In one embodiment, a reference count interval is set at a reference value R which is, $(S/T_S - T_F)T_{cycle}$ The value S is a scaling factor, and $T_{cycle}$, is a system clock (SC) oscillation period. In one embodiment, circuit speed is measured on a 0 to S scale. The value is selected, for example, to establish the level of accuracy or granularity of a measure of circuit speed produced by the monitor circuit 10.

The system clock may be the clock used to set the overall frequency of operation of an integrated circuit on which the monitor circuitry 10 is disposed. In one embodiment, the system clock frequency may be preset at any of multiple operating frequencies such that it has a known time period (and frequency). Moreover, in one embodiment, unlike the variable oscillator, once the system clock is set, it remains substantially fixed at its set operating point despite PVT variations.

The starting count value in the system clock counter 16 is, $(S/(T_S - T_F))T_S$.

Figure 2:
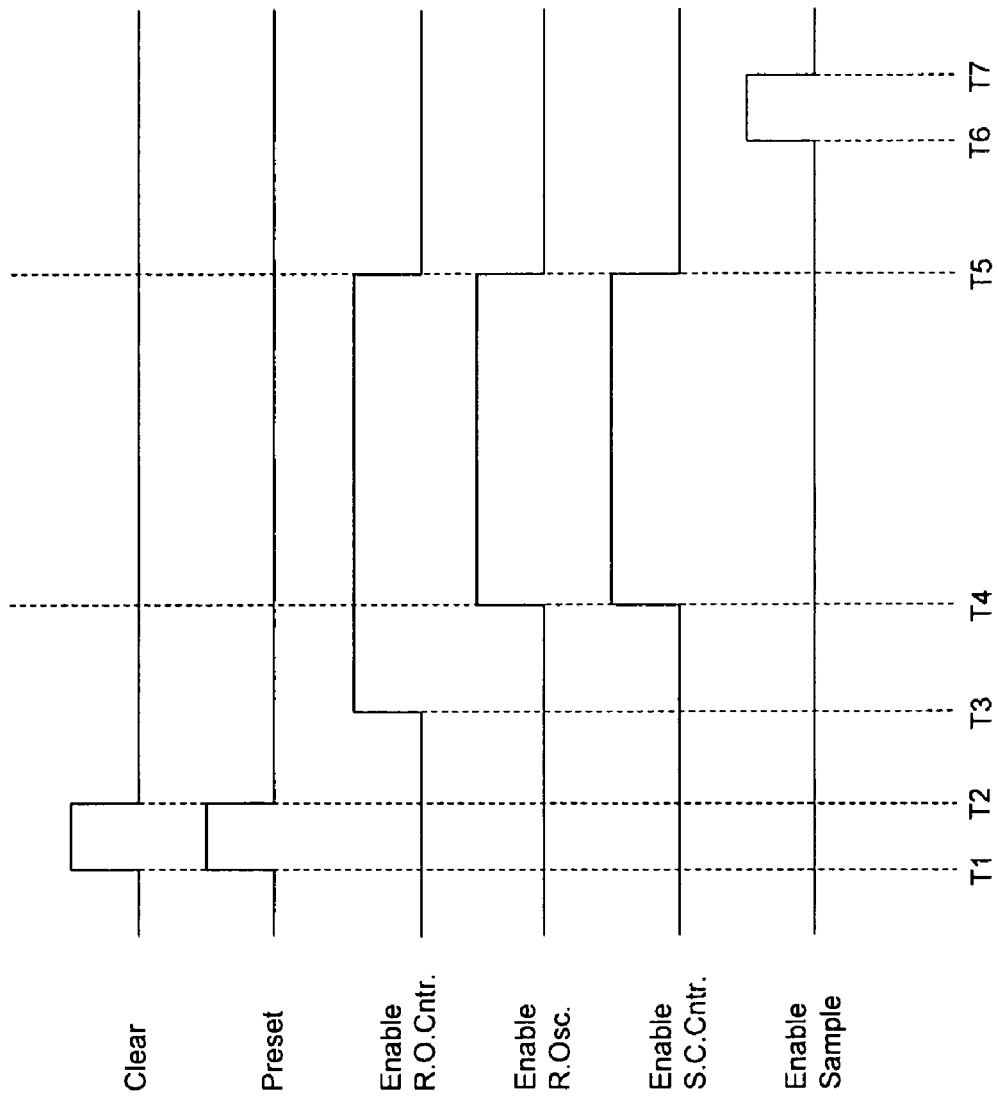
FIG. 2 is an illustrative timing diagram that explains the operation of the speed monitor circuit of FIG. 1.

FIG. 2 is an illustrative timing diagram that explains the operation of the monitor circuit 10 of FIG. 1. During time interval T1 to T2, the control circuit 24 provides a CLEAR signal on line 30 that clears the count value in the variable oscillator counter circuit 14 to zero (0). Also during time interval T1 to T2, the control circuit provides a PRESET signal on line 32 that presets a value in the system clock counter 16 to the starting count value, $(S/T_S - T_F)T_S$. At time T3, the control circuit 12 produces on line 34 an ENABLE VARIABLE OSCILLATOR signal value that causes the variable oscillator 12 to oscillate. At time T4, a reference value $R=(S/T_S - T_F)T_{cycle}$ is provided via a source on chip programmable configuration mechanism such as a register file. In one embodiment, the reference value R can be determined once the system clock cycle time is known, it can be fixed at all times thereafter, not just at time T4 on line 22. The application of the reference value R on line 22 causes the comparator 20 to produce on line 36, a value indicating that the value on line 22 does not match the count value provided by the reference clock counter on line 14. A no-match signal produced by the comparator 20 on line 36, at time T4, serves as an ENABLE REFERENCE COUNTER signal that causes the reference clock counter to begin to count up in response to variable oscillator oscillations, from zero (0). The rate at which the reference clock counter 14 counts is proportionate to the oscillation rate of the variable oscillator 12 under whatever PVT conditions may exist at the time. The no-match signal produced by comparator 20 on line 36 at time T4 also causes the control circuit 24 to substantially simultaneously provide an ENABLE SYSTEM CLOCK COUNTER signal value on line 38, that causes the system clock counter 16 to begin to count down from the starting count value in response to the system clock, SC signal. The rate at which the system clock counter 16 counts is proportionate to the system clock rate, $1/T_{cycle}$, which is substantially fixed despite possible variations in PVT conditions.

When the reference clock counter has counted a reference count interval spanning from 0 to R, the system clock counter will have a value indicative of circuit speed. More specifically, at time T5, when a count value provided by the reference clock counter 14 on line 28 matches the reference value R provided on line 22, the comparator produces on line 36 a value indicating that the value on line 22 does match the count value provided by the reference clock counter on line 14. When the count on line 28 matches R on line 22 the ENABLE REFERENCE COUNTER signal on line 36 changes to a value that causes the variable oscillator counter 14 to stop counting. The changed value of the ENABLE REFERENCE COUNTER signal on line 36 also causes the control circuit 24 to substantially simultaneously provide a ENABLE SYSTEM CLOCK COUNTER signal value on line 38 that causes the system clock counter 16 to stop counting and to provide on line 34 a signal that causes the variable oscillator 12 to stop oscillating.

At time T5, which the approximate moment when the reference counter 14 completes the reference count interval, and a reference clock count on line 28 first matches the reference value R on line 22, the count value in the system clock counter 16 represents circuit speed (SP) as, $SP=(S(T_S - T_A)/(T_S - T_F))$ The value, $T_A$, represents the actual variable oscillator time period, which is indicative of the actual performance, of the variable oscillator 12 under current PVT conditions, which is in turn, is indicative of circuit speed in the region of the monitor circuit 10.

During time T6 to T7, the control circuit 24 provides an ENABLE SAMPLE signal value on line 40 that causes the output circuit 18 to input from line 42 a circuit speed value SP provided by the system clock counter 18. The circuit speed value SP is provided as an output signal by the output circuit 18 on line 44. In one embodiment, the output circuit 18 is a latch circuit, which can temporarily store the speed value.

It will be appreciated that the reciprocal of the variable oscillator performance range $1/(T_S-T_F)$ in essence serves as a proportionality factor that correlates the actual variable oscillator performance (measured in terms of $T_S-T_A$) under given PVT conditions to the scale S. For example if the variable oscillator 12 is operating at the worst corner, $T_A=T_S$, then the proportionality factor will be $(T_S-T_S)/(T_S-T_F)=0$, and the circuit speed SP will be 0. Alternatively, for example, if the variable oscillator 12 is operating at the best corner, $T_A=T_F$, then the proportionality factor will be $(T_S-T_F)/(T_S-T_F)=1$, and the circuit speed SP as scaled by S, will be S. Thus, a circuit speed value SP produced by the system clock counter 16 varies between 0 and S, depending upon the actual time period $T_A$ of the variable oscillator 12 (or conversely its actual frequency of operational $1/T_A$).

Thus, in one embodiment, circuit speed, SP, is measured on a linear scale from 0 to S. The scale value S may be selected based upon desired accuracy or granularity of circuit speed measurement. Moreover, the speed value SP is determined relative to a selected clock time period, $T_{cycle}$ (and conversely its frequency) that is substantially invariant in the face of changes in PVT conditions, and therefore, the scale S is independent of the actual clock time period of the selected clock time period. In other words, the same scale 0 to S applies regardless of the system clock frequency setting. That is to say, the scale applies regardless of system clock frequency because the reference value removes the dependence upon this frequency. Thus, the circuit speed, SP, represents the speed of the variable oscillator 12 relative to a predetermined range of oscillation frequencies, regardless of the frequency of the reference system clock. In one embodiment, the range affects the initial value of the system clock counter and the reference value. Therefore, the disclosed embodiment is operable over a wide range of system clock frequencies, although different reference values typically would be provided on line 22 for different system clock frequencies.

Figure 3:
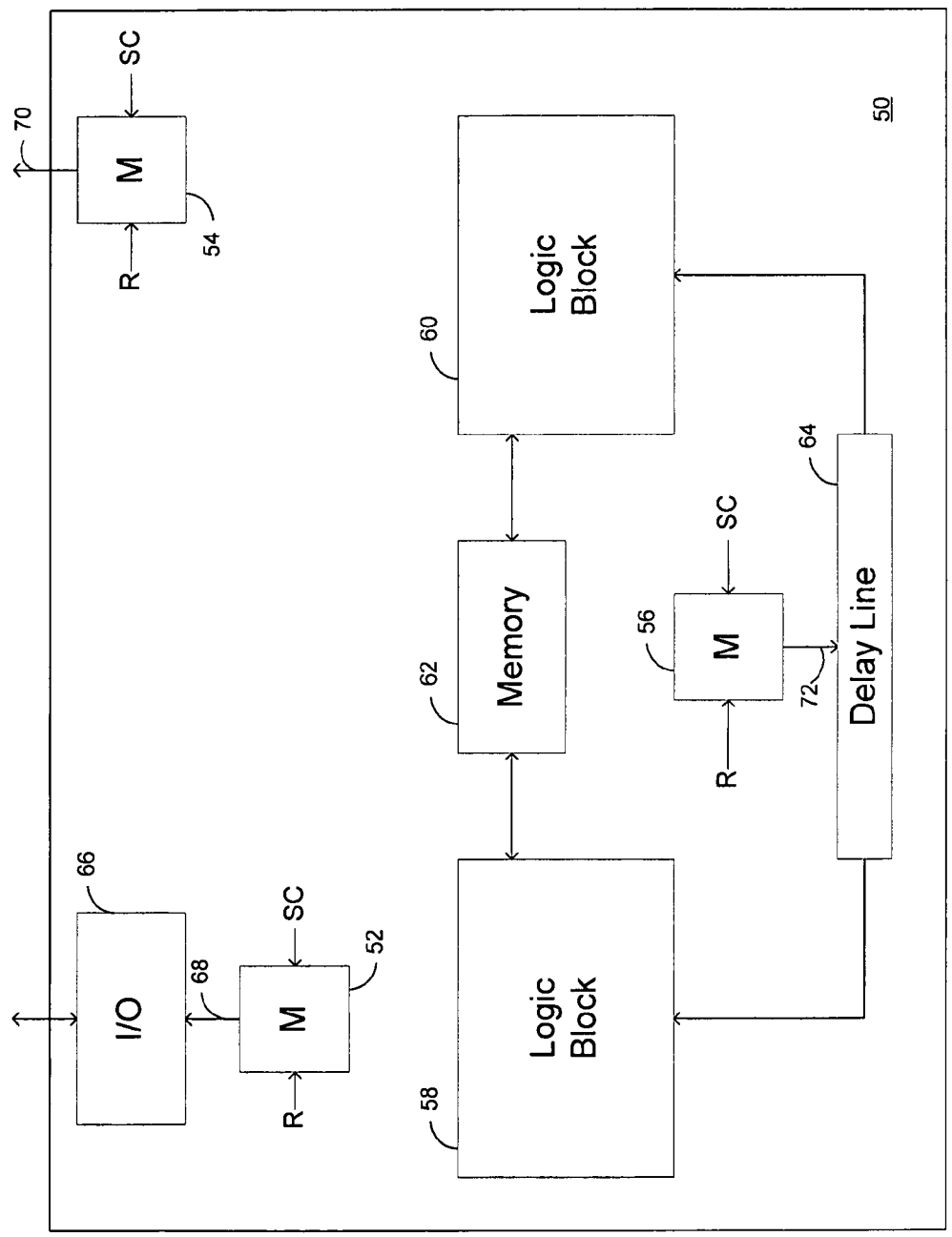
FIG. 3 is a generalized block diagram of an integrated circuit (IC) that includes several speed monitor circuits of the general type shown in FIG. 1, providing speed compensation signals to other circuit components on the IC.

FIG. 3 is a generalized block diagram of an integrated circuit 50 that includes first, second and third monitor circuits 52, 54 and 56 provide circuit speed signals indicative of circuit speed at different location on the IC 50. This drawing is provided to illustrate the use of monitor circuits distributed about an IC to monitor the effects of PVT variations at different circuit locations and to provide corresponding circuit speed compensation signals to adjacent circuit components. The overall functionality of the IC 50 is irrelevant to the invention. The example IC 50 includes first and second logic blocks 58 and 60 and includes memory block 62. The IC also includes a delay line circuit 64 and I/O circuit 66. The first monitor circuit 52 is disposed adjacent the I/O circuit 66 and provides on line 68 a circuit speed signal that can be used, for example, to calibrate output buffers for drive impedance matching within the I/O circuit 66. The second monitor circuit 54 is disposed adjacent on the IC 50 and provides on external line 70 a circuit speed signal indicative of the circuit speed in the vicinity of the second monitor circuit 54. The third monitor circuit 56 is disposed adjacent the delay line circuit 64 and provides on line 72 a circuit speed signal that can be used to continuously adjust circuit delay of signals communicated between the first and second logic blocks 58, 60.

Figure 4:
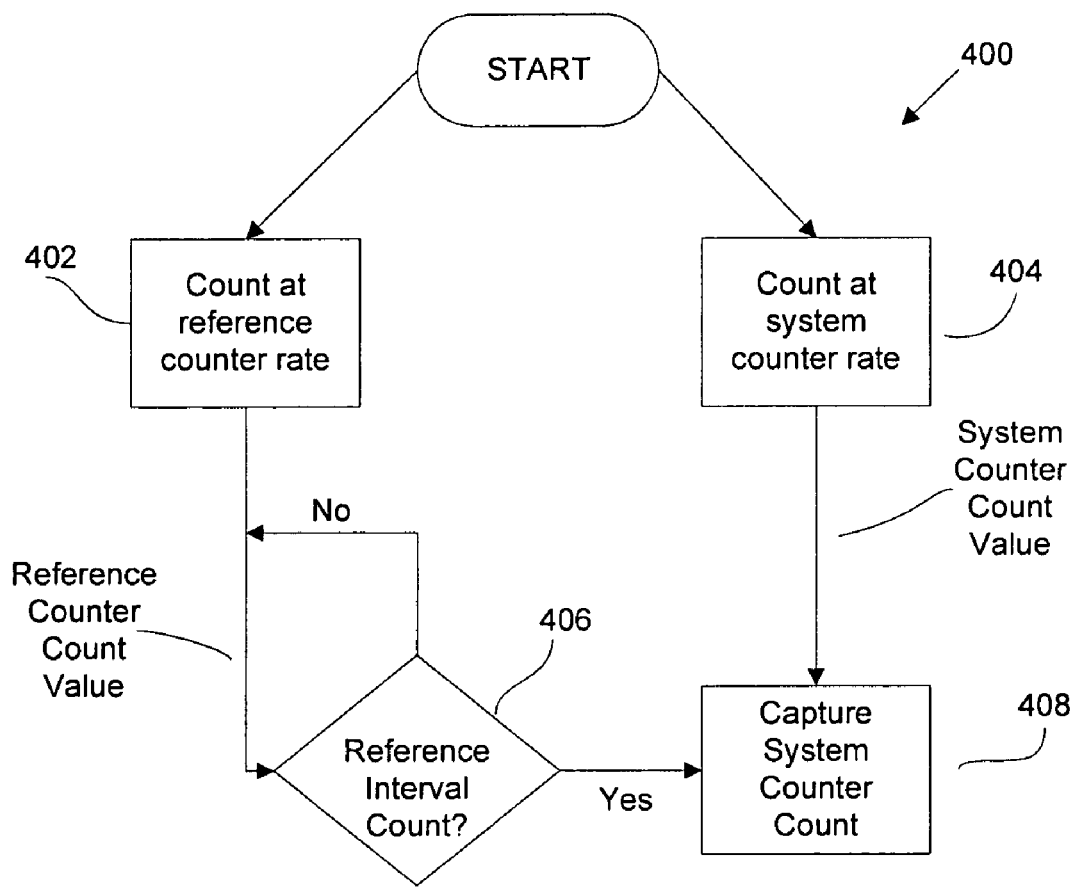
FIG. 4 is an illustrative flow diagram of a method of monitoring integrated circuit performance in accordance with an embodiment of the invention.

FIG. 4 is an illustrative flow diagram 400 of a method of monitoring integrated circuit performance in accordance with an embodiment of the invention. In step 402 a variable oscillator 12 that has an oscillation time period that varies within an expected range with variations in one or more of process, voltage or temperature provides a signal that causes a count of the reference counter 14 to count a reference clock interval at rate a proportional to an oscillation frequency of the variable oscillator 12. In step 404, a system clock source that has a frequency that substantially does not vary with variations in one or more of process, time or voltage causes a count of a system clock counter 16 counter to change, starting at a start value, at rate proportional to an oscillation frequency of the clock source.

The counts in steps 402 and 404 start substantially simultaneously. Thus, while the reference counter 14 counts a reference count interval, the system counter 16 counts beginning from the start count. The rate at which the reference counter 14 counts depends upon PVT factors, but the rate at which the system counter 16 counts does not depend upon PVT factors.

In decision step 406 for each count of the reference counter 14, a determination is made as to whether the reference counter 14 has counted a reference count interval. If a determination is made in decision step 406 that the reference counter 14 has not yet counted a reference count interval, then the system counter 16 continues to count, and the decision step monitors the next count of the reference counter 14. If on the other hand, a determination is made in decision step 406 that the reference counter 14 has counted a reference count interval, then in step 408, the count of the system counter 16, at or about the moment the reference counter 14 completes the reference count interval, is captured for provision to an output circuit 18. In one embodiment, the start value and the reference count interval are selected so that a count value produced by the system counter 16 produces a value indicative of variable oscillator speed at or about the moment when the count of the reference counter 14 finishes counting the reference count interval. Thus, the captured count represents circuit "speed" (SP).

Figure 5:
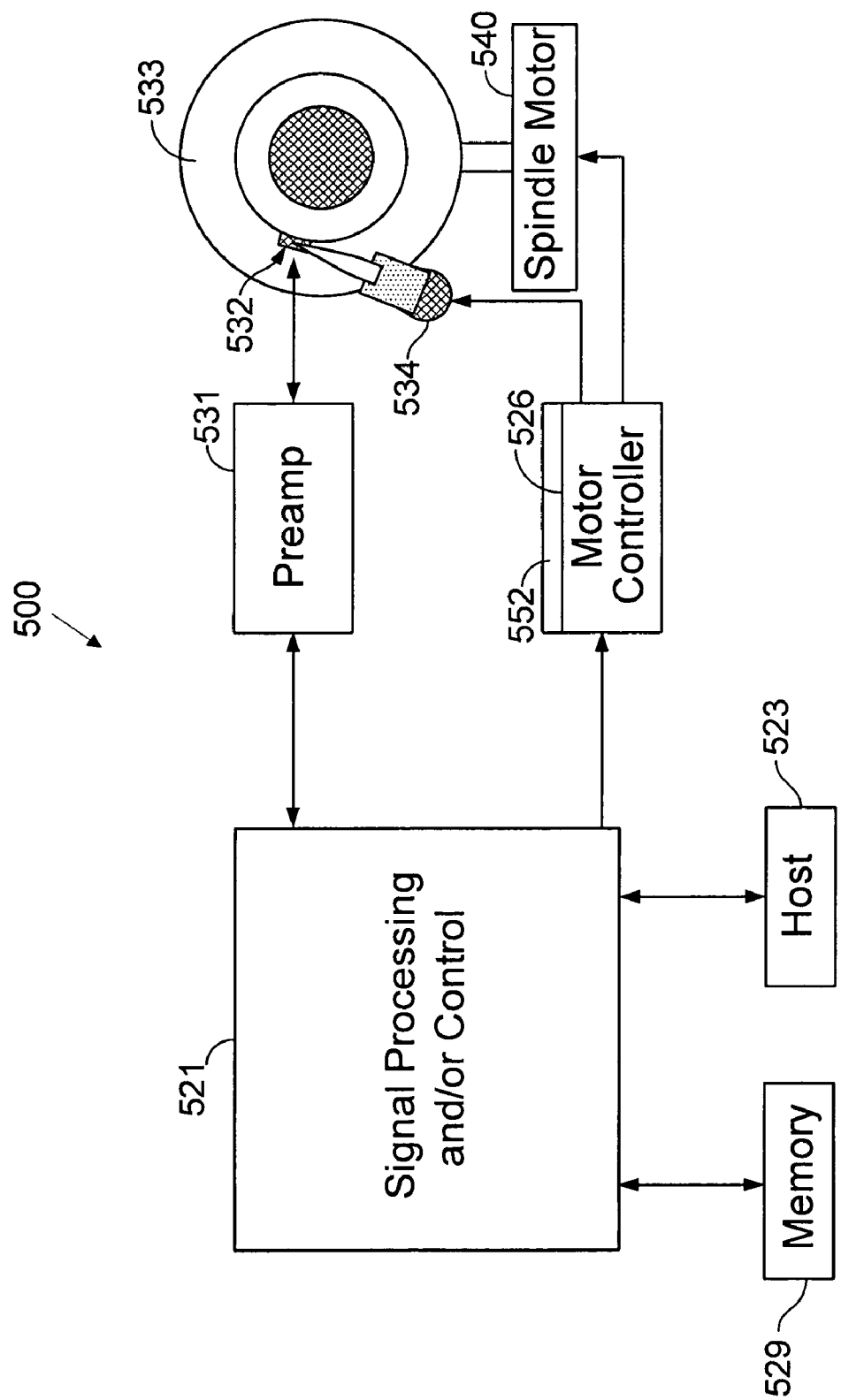
FIG. 5 is an illustrative block diagram of a hard disk drive (HDD) system that includes performance monitoring circuitry in accordance with an embodiment of the invention.

FIG. 5 is an illustrative block diagram of a hard disk drive (HDD) system 500 that includes performance monitoring circuitry in accordance with an embodiment of the invention. Performance monitor circuitry (not shown) may be included in either or both signal processing and/or control circuitry 521. FIG. 3 illustrates example of uses of performance monitoring circuitry applicable to the control circuitry 521. In some implementations, the signal processing and/or control circuitry 521 and/or other circuits (not shown) in the disk drive may process data, perform coding and/or encryption, perform calculations, and/or format data that is output to and/or received from a (magnetic) storage medium 533.

The disk drive may communicate with a host device 523 such as a computer, mobile computing devices such as personal digital assistants, cellular phones, media or MP3 players and the like, and/or other devices via one or more wired or wireless communication links. The disk drive may be connected to memory 529 such as random access memory (RAM), low latency nonvolatile memory such as flash memory, read only memory (ROM) and/or other suitable electronic data storage. Moreover, the signal processing and/or control circuits 521 may be implemented as a system-on-chip (SOC), and the memory 529 may be disposed on or off such SOC.

Figure 6:
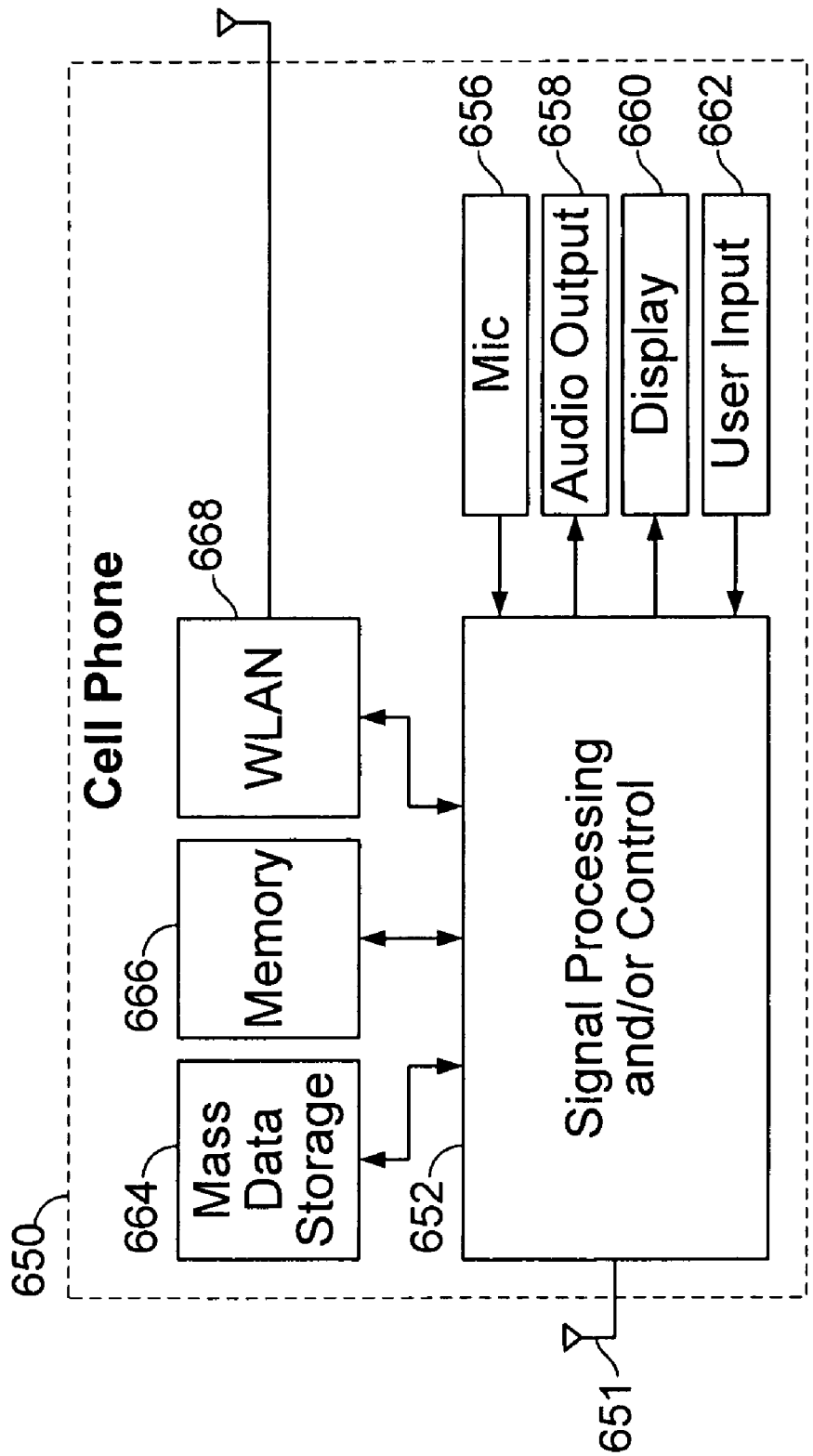
FIG. 6 is an illustrative block diagram of a cellular phone system that includes performance monitoring circuitry in accordance with an embodiment of the invention.

FIG. 6 is an illustrative block diagram of a cellular phone system 650 that includes performance monitoring circuitry in accordance with an embodiment of the invention. The cellular phone 650 includes a cellular antenna 651. Signal processing and/or control circuits 652 communicate with a WLAN interface and/or memory 666 or mass data storage 664 of the cellular phone 650. In some implementations, the cellular phone 650 includes a microphone 656, an audio output 658 such as a speaker and/or audio output jack, a display 660 and/or an input device 662 such as a keypad, pointing device, voice actuation and/or other input device. The control circuitry 652 includes performance monitoring circuitry (not shown). FIG. 3 illustrates example of uses of performance monitoring circuitry applicable to the control circuitry 652. The signal processing and/or control circuits 652 and/or other circuits (not shown) in the cellular phone 650 may process data, perform coding and/or encryption, perform calculations, format data and/or perform other cellular phone functions.

More particularly, the cellular phone 650 may communicate with mass data storage 664 that stores data in a nonvolatile manner such as optical and/or magnetic storage devices for example hard disk drives (HDD) and/or DVDs. At least one HDD may have the configuration shown in FIG. 5 and/or at least one DVD player may have the general configuration shown in FIG. 5. The HDD may be a mini HDD that includes one or more platters having a diameter that is smaller than approximately 1.8". The cellular phone 650 may be connected to memory 666 such as RAM, ROM, low latency nonvolatile memory such as flash memory and/or other suitable electronic data storage. The cellular phone 650 also may support connections with a WLAN via a WLAN network interface 668.

Figure 7:
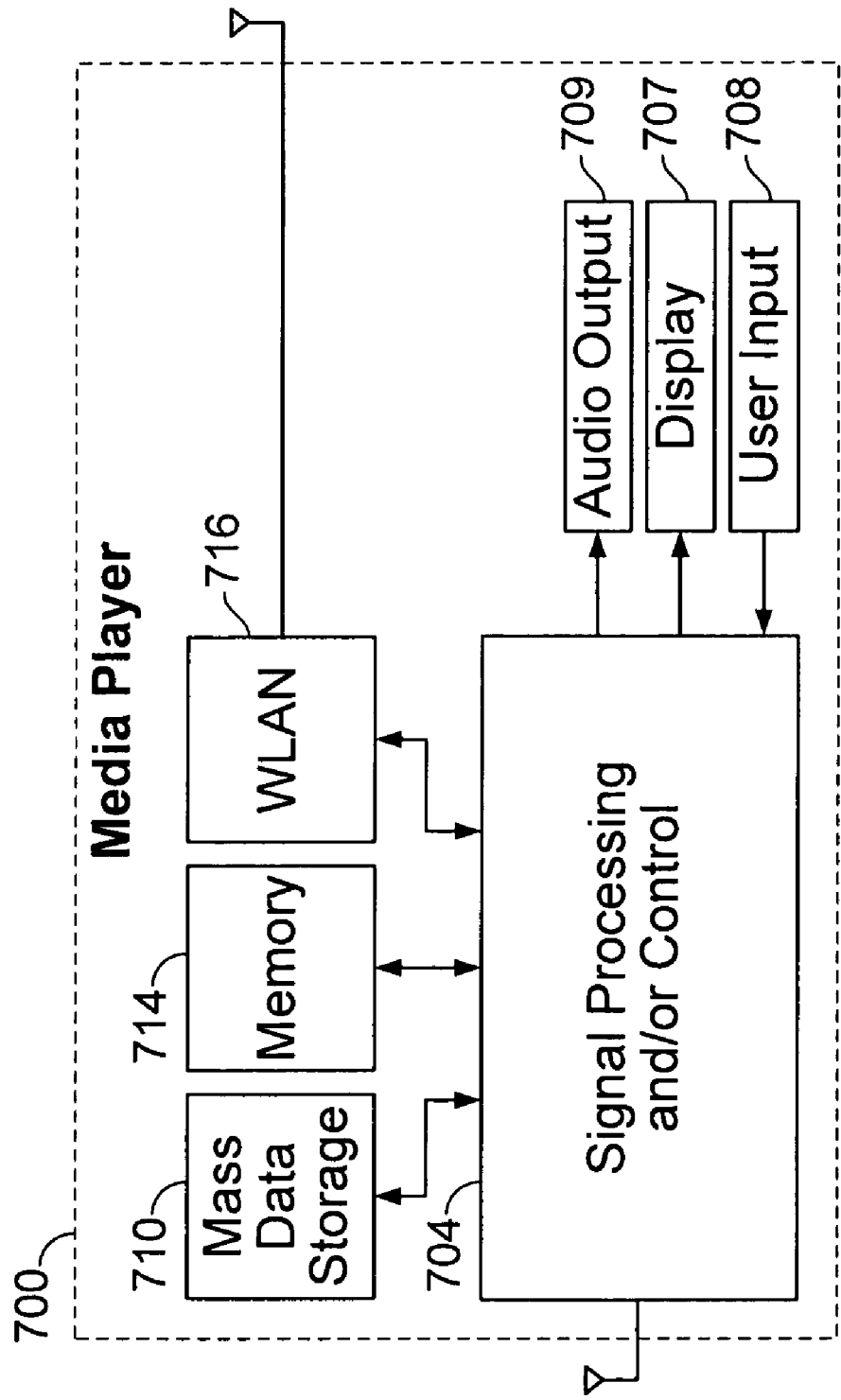
FIG. 7 is an illustrative block diagram of a media player that includes performance monitor circuitry in accordance with an embodiment of the invention.

FIG. 7 is an illustrative block diagram of a media player 700 that includes performance monitor circuitry in accordance with an embodiment of the invention. In one embodiment the media player may comprise an MP3 player, for example. The media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 5 and/or at least one DVD may have the general configuration shown in FIG. 5. The HDD may be a mini HDD that includes one or more platters having a diameter that is smaller than approximately 1.8". The media player 700 may be connected to memory 714 such as RAM, ROM, low latency nonvolatile memory such as flash memory and/or other suitable electronic data storage. The media player 700 also may support connections with a WLAN via a WLAN network interface 716. Still other implementations in addition to those described above are contemplated.

Signal processing and/or control circuits 704 communicate with a WLAN interface 716 and/or mass data storage 710 and/or memory 714 of the media player 700. The control circuitry 704 includes performance monitoring circuitry (not shown). FIG. 3 illustrates example of uses of performance monitoring circuitry applicable to the control circuitry 704. In some implementations, the media player 700 includes a display 707 and/or a user input 708 such as a keypad, touchpad and the like. In some implementations, the media player 700 may employ a graphical user interface (GUI) that typically employs menus, drop down menus, icons and/or a point-and-click interface via the display 707 and/or user input 708. The media player 700 further includes an audio output 709 such as a speaker and/or audio output jack. The signal processing and/or control circuits 704 and/or other circuits (not shown) of the media player 700 may process data, perform coding and/or encryption, perform calculations, format data and/or perform any other media player function.

Figure 8:
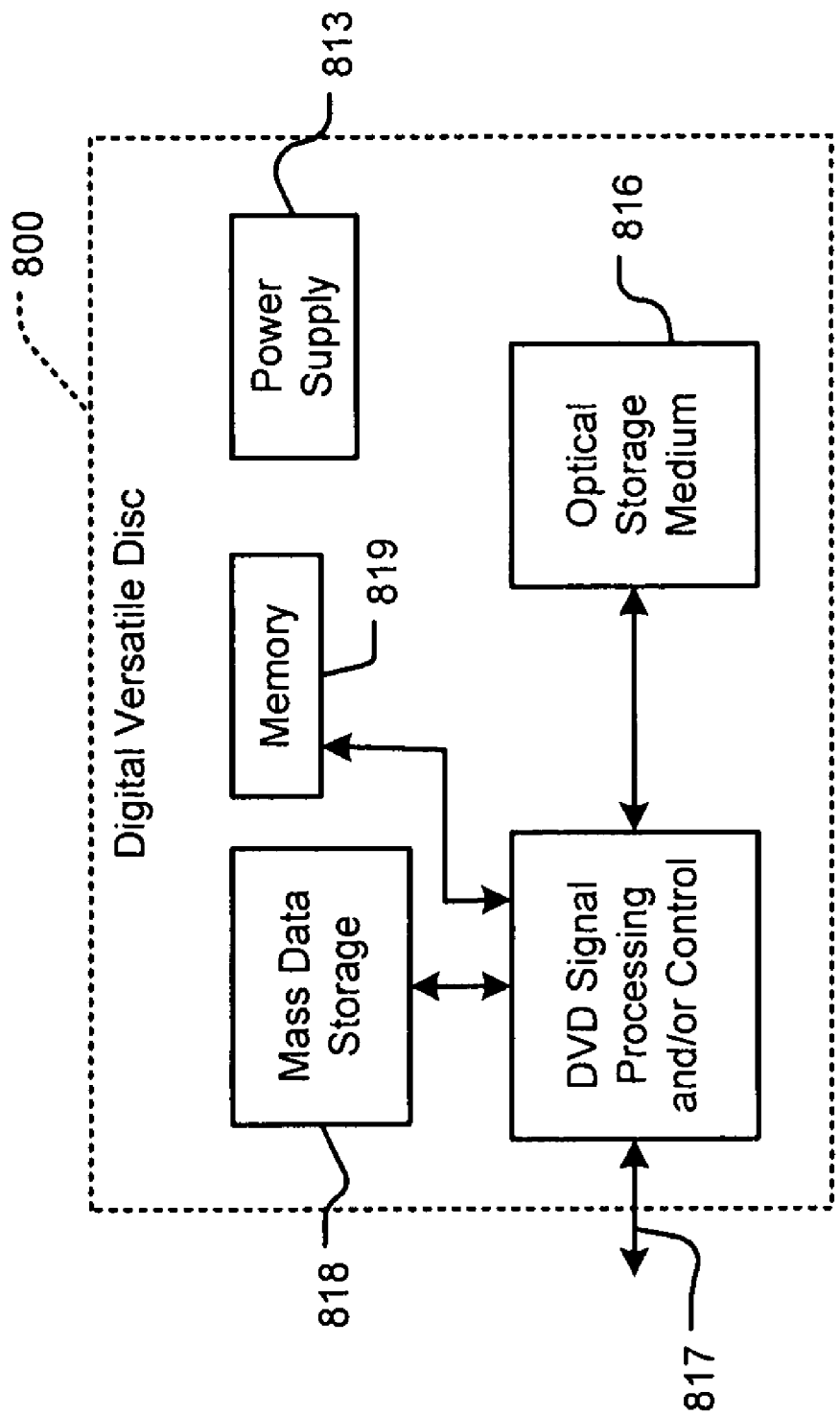
FIG. 8 is an illustrative block diagram of a digital versatile disk (DVD) drive that includes performance monitor circuitry in accordance with an embodiment of the invention.

FIG. 8 is an illustrative block diagram of a digital versatile disk (DVD) drive 800 that includes performance monitor circuitry in accordance with an embodiment of the invention. The performance monitor circuitry may be implemented in either or both signal processing and/or control circuits, 812, mass data storage 818 and/or a power supply 813. The signal processing and/or control circuit 812 and/or other circuits (not shown) in the DVD 800 may process data, perform coding and/or encryption, perform calculations, and/or format data that is read from and/or data written to an optical storage medium 816. In some implementations, the signal processing and/or control circuit 812 and/or other circuits (not shown) in the DVD 800 can also perform other functions such as encoding and/or decoding and/or any other signal processing functions associated with a DVD drive.

The DVD drive 800 may communicate with an output device (not shown) such as a computer, television or other device via one or more wired or wireless communication links 817. The DVD 800 may communicate with mass data storage 818 that stores data in a nonvolatile manner. The mass data storage 818 may include a hard disk drive (HDD). The HDD may have the configuration shown in FIG. 5. The HDD may be a mini HDD that includes one or more platters having a diameter that is smaller than approximately 1.8". The DVD 800 may be connected to memory 819 such as RAM, ROM, low latency nonvolatile memory such as flash memory and/or other suitable electronic data storage.

Figure 9:
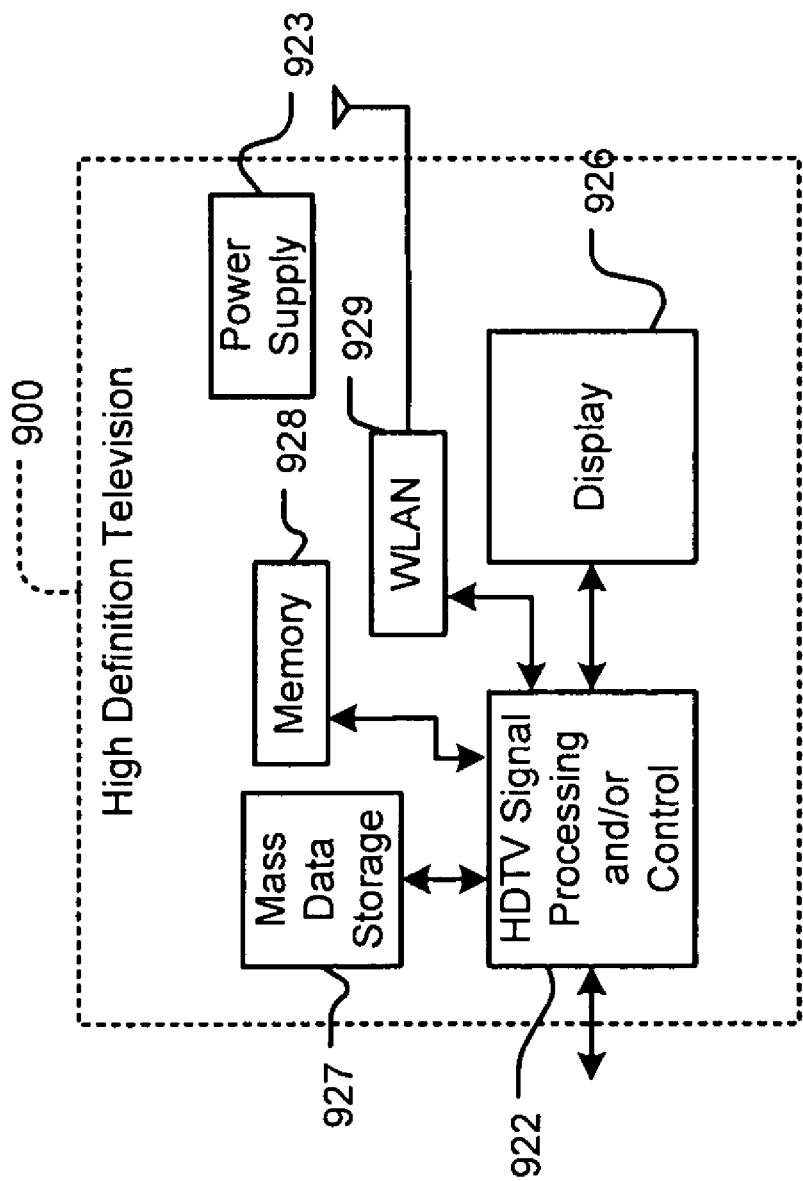
FIG. 9 is an illustrative block diagram of a high definition television (HDTB) that includes performance monitor circuitry in accordance with an embodiment of the invention.

FIG. 9 is an illustrative block diagram of a high definition television (HDTB) 900 that includes performance monitor circuitry in accordance with an embodiment of the invention. Performance monitor circuitry may be implemented in either or both signal processing and/or control circuits, 922, a WLAN interface 929, mass data storage 927 and/or a power supply 923. The HDTV 900 receives HDTV input signals in either a wired or wireless format and generates HDTV output signals for a display 926. In some implementations, signal processing circuit and/or control circuit 900 and/or other circuits (not shown) of the HDTV 900 may process data, perform coding and/or encryption, perform calculations, format data and/or perform any other type of HDTV processing that may be required.

The HDTV 900 may communicate with mass data storage 927 that stores data in a nonvolatile manner such as optical and/or magnetic storage devices. At least one HDD may have the configuration shown in FIG. 5 and/or at least one DVD may have the configuration shown in FIG. 8. The HDD may be a mini HDD that includes one or more platters having a diameter that is smaller than approximately 1.8". The HDTV 900 may be connected to memory 928 such as RAM, ROM, low latency nonvolatile memory such as flash memory and/or other suitable electronic data storage. The HDTV 900 also may support connections with a WLAN via a WLAN network interface 929.

Figure 10:
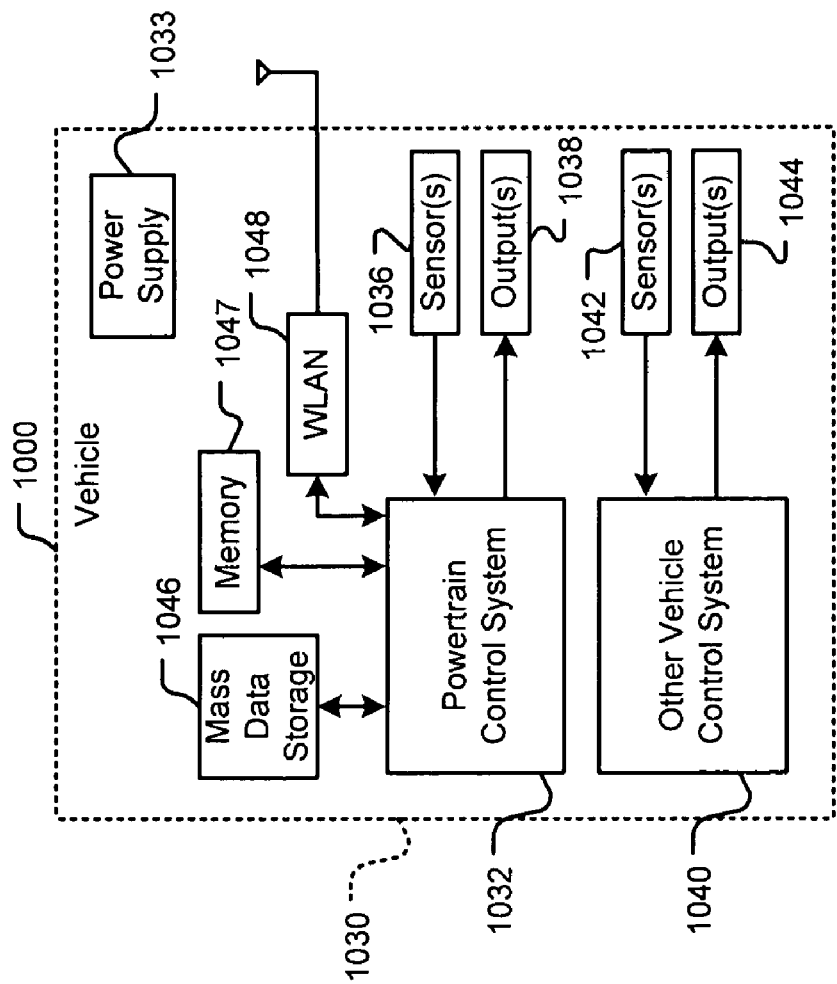
FIG. 10 is an illustrative block diagram of vehicle control systems that includes performance monitor circuitry in accordance with an embodiment of the invention.

FIG. 10 is an illustrative block diagram of a vehicle 1000 including control systems that include power monitor circuitry in accordance with an embodiment of the invention. In some implementations a powertrain control system 1032 receives inputs from one or more sensors 1036 such as temperature sensors, pressure sensors, rotational sensors, airflow sensors and/or any other suitable sensors and/or that generates one or more output control signals such as engine operating parameters, transmission operating parameters, and/or other control signals.

Other control systems 1040 of the vehicle 1000 may likewise receive signals from input sensors 1042 and/or output control signals to one or more output devices 1044. In some implementations, the control system 1040 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 1032 may communicate with mass data storage 1046 that stores data in a nonvolatile manner. The mass data storage 1046 may include optical and/or magnetic storage devices for example hard disk drives HDD and/or DVDs. At least one HDD may have the configuration shown in FIG. 5 and/or at least one DVD may have the configuration shown in FIG. 8. The HDD may be a mini HDD that includes one or more platters having a diameter that is smaller than approximately 1.8". The powertrain control system 1032 may be connected to memory 1047 such as RAM, ROM, low latency nonvolatile memory such as flash memory and/or other suitable electronic data storage. The powertrain control system 1032 also may support connections with a WLAN via a WLAN network interface 1048. The control system 1040 may also include mass data storage, memory and/or a WLAN interface (all not shown).

Figure 11:
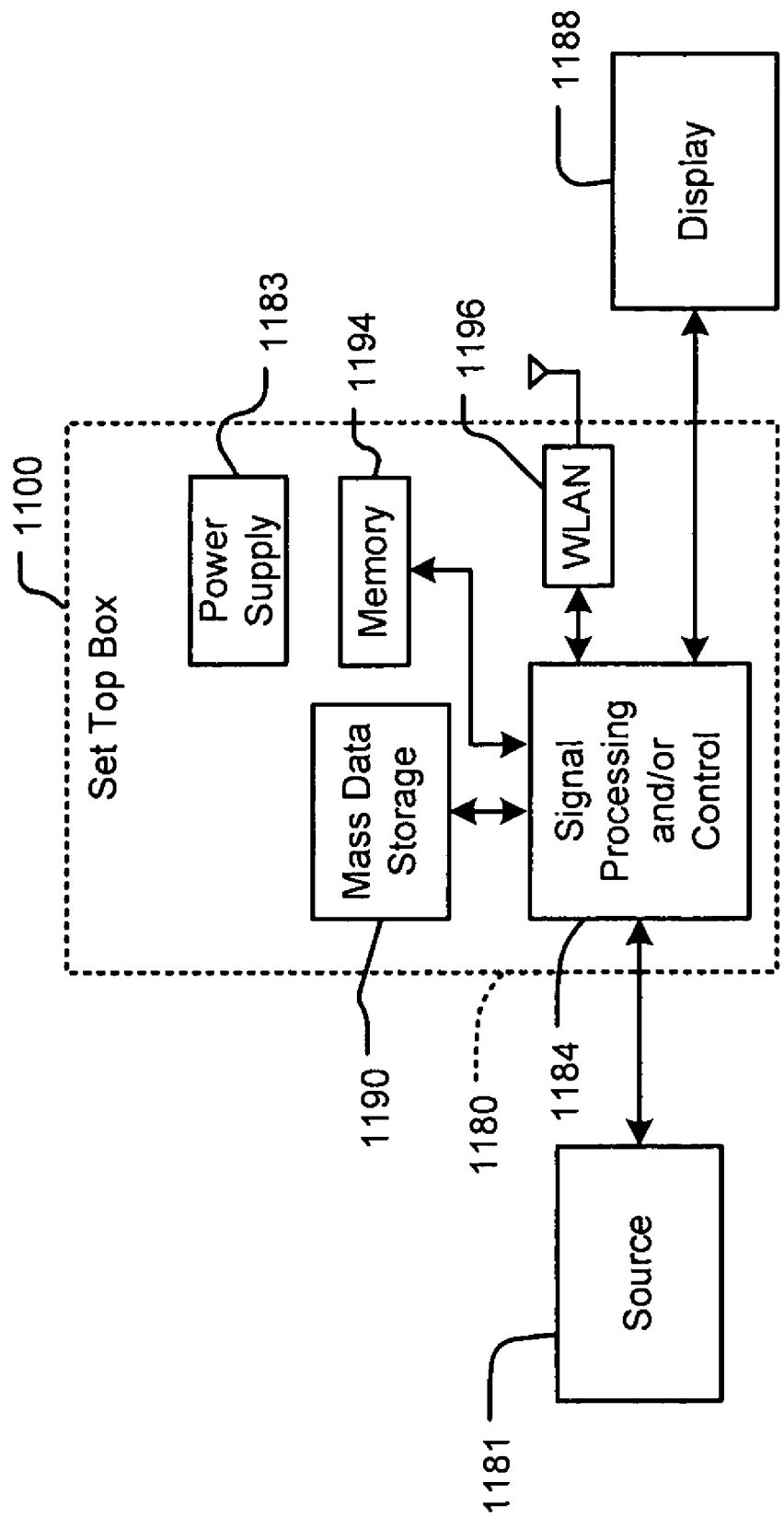
FIG. 11 is an illustrative block diagram of a set top box that includes performance monitor circuitry in accordance with an embodiment of the invention.

FIG. 11 is an illustrative block diagram of a set top box 1100 that includes performance monitor circuitry in accordance with an embodiment of the invention. Performance monitor circuitry may be implemented in either or both signal processing and/or control circuits 1184, a WLAN interface 1196, mass data storage 1190 and/or a power supply 1183. The set top box 1100 receives signals from a source 1181 such as a broadband source and outputs standard and/or high definition audio/video signals suitable for a display 1188 such as a television and/or monitor and/or other video and/or audio output devices. The signal processing and/or control circuits 1184 and/or other circuits (not shown) of the set top box 1100 may process data, perform coding and/or encryption, perform calculations, format data and/or perform any other set top box function.

The set top box 1100 may communicate with mass data storage 1190 that stores data in a nonvolatile manner. The mass data storage 1190 may include optical and/or magnetic storage devices for example hard disk drives HDD and/or DVDs. At least one HDD may have the configuration shown in FIG. 5 and/or at least one DVD may have the configuration shown in FIG. 8. The HDD may be a mini HDD that includes one or more platters having a diameter that is smaller than approximately 1.8". The set top box 1100 may be connected to memory 1194 such as RAM, ROM, low latency nonvolatile memory such as flash memory and/or other suitable electronic data storage. The set top box 1100 also may support connections with a WLAN via a WLAN network interface 1196.

While the invention is described herein with reference to various illustrative features, aspects and embodiments, it will be appreciated that the invention is susceptible of variations, modifications and other embodiments, other than those specifically shown and described. For example, although signal processing and/or control circuitry embodiments of the invention have been described for use in disk drives, cell phones and media players, it will be appreciated that circuitry in accordance with the invention may be included in other systems such as set top box on HDTV. Moreover, for example, an inverted scale relative speed metric (i.e., Speed=S corresponds to worst PVT corner performance, and Speed=0 corresponds to best PVT corner performance) can be employed in accordance with an embodiment of the invention, by loading into the system counter 16 an initial value having a negative value $(S/(T_F-T_S))T_F$, and counting upward. In one embodiment, the count would wrap around the system counter, and this initial value is expected to be $(S/(T_S-T_F))$ $T_F-1$ below a maximal value the counter can reach before wrapping around. The invention is therefore to be broadly interpreted and construed as including all such alternative variations, modifications and other embodiments within its spirit and scope as hereinafter claimed.

The invention claimed is:

1. An integrated circuit, comprising:
   an oscillator that generates an oscillator signal;
   a first counter that generates a first count based on transitions of the oscillator signal;
   a first circuit that generates a match signal based on the first count and a reference count;
   a second counter that
      generates a second count that is initialized at a starting count, and
      adjusts the second count based on transitions of a reference clock signal; and
   an output circuit that outputs an oscillator speed based on the second count and the match signal,
   wherein the oscillator speed is defined by a range that is independent of a frequency of the reference clock signal.

2. The integrated circuit of claim 1 wherein the range is from a first value to a second value, and wherein the first value corresponds to a first corner and wherein the second value corresponds to a second corner.

3. The integrated circuit of claim 1 wherein the starting count is based on:
   a product of a first oscillator corner period,
   a scaling factor, and
   a reciprocal of a difference between the first oscillator corner period and a second oscillator corner period.

4. The integrated circuit of claim 1 wherein the reference count is based on:
   a product of a clock period of the reference clock signal,
   a scaling factor, and
   a reciprocal of a difference between a first oscillator corner period and a second oscillator corner period.

5. The integrated circuit of claim 1 wherein:
   the starting count is based on
      a product of a first oscillator corner period,
      a scaling factor, and
      a reciprocal of a difference between the first oscillator corner period and a second oscillator corner period; and
   the reference count is based on
      a product of a clock period of the reference clock signal,
      the scaling factor, and
      the reciprocal of the difference between the first oscillator corner period and the second oscillator corner period.

6. The integrated circuit of claim 1 wherein the oscillator includes a ring oscillator.

7. The integrated circuit of claim 1 further comprising a second circuit that sets the second count equal to the starting count.

8. The integrated circuit of claim 1 further comprising a second circuit that sets the second count equal to the starting count and that disables the second counter when the match signal is generated.

9. The integrated circuit of claim 1 wherein the reference clock signal comprises a system clock signal.

10. The integrated circuit of claim 1 wherein the first count changes at an oscillation frequency of the oscillator.

11. The integrated circuit of claim 1 wherein the second counter decrements the second count from the starting count.

12. The integrated circuit of claim 1 wherein the second counter increments the second count from the starting count.

13. The integrated circuit of claim 1 wherein the starting count is based on (S/(TS TF))TS, and wherein S is a scaling factor, TS is a first oscillator corner period and TF is a second oscillator corner period.

14. The integrated circuit of claim 1 wherein the starting count is based on (S/(TS TF))TF, and wherein S is a scaling factor, TS is a first oscillator corner period and TF is a second oscillator corner period.

15. The integrated circuit of claim 1 wherein the reference count is based on (S/(TS TF))Tcycle, where S is a scaling factor, TS is a first oscillator corner period, TF is a second oscillator corner period, and Tcycle is a period of the reference clock.

16. An integrated circuit, comprising:
a variable oscillator that generates an oscillator signal, wherein the oscillator signal is dependent upon at least one of process, temperature and voltage; and
a speed determining circuit that
receives the oscillator signal and a reference clock signal,
generates an oscillator speed based on the oscillator signal and the reference clock signal,
generates a first count based on transitions of the oscillator signal, and
generates a match signal based on the first count and a reference count,
wherein the oscillator speed is defined by a range from a first value to a second value, and wherein the first value corresponds to a first process corner and the second value corresponds to a second process corner.

17. The integrated circuit of claim 16 wherein the reference clock signal is substantially independent of process, temperature and voltage.

18. The integrated circuit of claim 16 wherein the speed determining circuit:
generates a second count that is initialized at a starting count,
adjusts the second count based on transitions of the reference clock signal, and
outputs the oscillator speed based on the second count and the match signal.

19. The integrated circuit of claim 18 wherein the starting count is based on:
a product of a first oscillator corner period,
a scaling factor and a reciprocal of a difference between the first oscillator corner period, and
a second oscillator corner period.

20. The integrated circuit of claim 18 wherein the reference count is based on:
a product of a clock period of the reference clock signal,
a scaling factor and a reciprocal of a difference between a first oscillator corner period, and
a second oscillator corner period.

21. The integrated circuit of claim 18 wherein:
the starting count is based on
a product of a first oscillator corner period,
a scaling factor, and
a reciprocal of a difference between the first oscillator corner period and a second oscillator corner period; and
the reference count is based on
a product of a clock period of the reference clock signal, the scaling factor, and
the reciprocal of the difference between the first oscillator corner period and the second oscillator corner period.

22. The integrated circuit of claim 18 wherein the variable oscillator includes a ring oscillator.

23. The integrated circuit of claim 18 wherein the speed determining circuit sets the second count equal to the starting count.

24. A method of determining operating speed in an integrated circuit, comprising:
generating an oscillator signal;
generating a first count based on transitions of the oscillator signal;
generating a match signal based on the first count and a reference count;
generating a second count that is initialized at a starting count;
adjusting the second count based on transitions of a reference clock signal; and
outputting an oscillator speed based on the second count and the match signal, wherein the oscillator speed is defined by a range that is independent of a frequency of the reference clock signal.

25. The method of claim 24 wherein the range is from a first value to a second value, and wherein the first value corresponds to a first corner and wherein the second value corresponds to a second corner.

26. The method of claim 24 wherein:
the starting count is based on
a product of a first oscillator corner period,
a scaling factor, and
a reciprocal of a difference between the first oscillator corner period and a second oscillator corner period; and
the reference count is based on
a product of a clock period of the reference clock signal, the scaling factor, and
the reciprocal of the difference between the first oscillator corner period and the second oscillator corner period.

27. The method of claim 24 wherein the starting count is based on (S/(TS TF))TS, and wherein S is a scaling factor, TS is a first oscillator corner period and TF is a second oscillator corner period.

28. The method of claim 24 wherein the reference count is based on (S/(TS TF))Tcycle, where S is a scaling factor, TS is a first oscillator corner period, TF is a second oscillator corner period, and Tcycle is a period of the reference clock.

29. A method for determining operating speed in integrated circuit, comprising:
generating an oscillator signal that is dependent upon at least one of process, temperature and voltage;
receiving the oscillator signal and a reference clock signal;
generating an oscillator speed based on the oscillator signal and the reference clock signal;
defining the oscillator speed using a range from a first value to a second value, wherein the first value corresponds to a first process corner and the second value corresponds to a second process corner;

generating a first count based on transitions of the oscillator signal; and generating a match signal based on the first count and a reference count.

30. The method of claim 29 wherein the reference clock signal is substantially independent of process, temperature and voltage.

31. The integrated circuit of claim 29 further comprising:
generating a second count that is initialized at a starting count;
adjusting the second count based on transitions of the reference clock signal; and
outputting the oscillator speed based on the second count and the match signal.

32. The integrated circuit of claim 31 wherein:
the starting count is based on
a product of a first oscillator corner period,
a scaling factor, and
a reciprocal of a difference between the first oscillator corner period and a second oscillator corner period; and
the reference count is based on
a product of a clock period of the reference clock signal,
the scaling factor, and
the reciprocal of the difference between the first oscillator corner period and the second oscillator corner period.

* * * * *